(12) United States Patent
Peterson et al.

(10) Patent No.: US 12,108,557 B2
(45) Date of Patent: Oct. 1, 2024

(54) BACKPLANE-ATTACHED ACOUSTICALLY REACTIVE ELEMENTS

(71) Applicant: Dell Products L.P., Round Rock, TX (US)

(72) Inventors: Chris Everett Peterson, Austin, TX (US); Paul Allen Waters, Austin, TX (US); Daniel J. Carey, Austin, TX (US); Evangelos Koutsavdis, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 94 days.

(21) Appl. No.: 17/816,171

(22) Filed: Jul. 29, 2022

(65) Prior Publication Data
US 2024/0040735 A1 Feb. 1, 2024

(51) Int. Cl.
*H05K 7/14* (2006.01)
*G10K 11/16* (2006.01)

(52) U.S. Cl.
CPC ......... *H05K 7/1488* (2013.01); *G10K 11/161* (2013.01); *H05K 7/1487* (2013.01)

(58) Field of Classification Search
None
See application file for complete search history.

(56) References Cited

U.S. PATENT DOCUMENTS

| 2020/0068741 A1* | 2/2020 | Waters | G06F 1/20 |
| 2022/0095480 A1* | 3/2022 | Waters | G10K 11/172 |

\* cited by examiner

*Primary Examiner* — James Wu
*Assistant Examiner* — Christopher L Augustin
(74) *Attorney, Agent, or Firm* — McDermott Will & Emery LLP

(57) ABSTRACT

Embodiments may be generally directed to a system for generating reactive acoustic energy for reducing acoustic noise in a chassis of an information handling system. A set of acoustically reactive elements may be positioned relative to a backplane comprising a plurality of backplane openings. Each acoustically reactive element comprises a plurality of walls and an acoustical energy reducing opening. The plurality of walls define an internal volume, wherein at least one wall is aligned parallel with a direction of airflow. The acoustical energy reducing opening may be oriented substantially parallel with the direction of the airflow and configured for the airflow passing the acoustically reactive element to pass the acoustical energy reducing opening to generate acoustic energy at a frequency based on the set of parameters of the acoustically reactive element.

14 Claims, 8 Drawing Sheets

BACKPLANE-ATTACHED ACOUSTICALLY REACTIVE ELEMENTS

BACKGROUND

Field of the Disclosure

This disclosure relates generally to information handling systems and more particularly to a system of backplane-attached acoustically reactive elements capable of reducing acoustic energy in a chassis of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

One or more embodiments may be directed to a system for generating reactive acoustic energy for reducing acoustic noise produced by a fan generating an airflow in a chassis of an information handling system. The system may comprise a set of acoustically reactive elements positioned relative to a backplane comprising a plurality of backplane openings. In some embodiments, each acoustically reactive element comprises a plurality of walls, wherein the plurality of walls define an internal volume, wherein at least one wall is aligned parallel with a direction of airflow and an acoustical energy reducing opening oriented substantially parallel with the direction of the airflow and configured for the airflow passing the acoustically reactive element to pass the acoustical energy reducing opening to generate acoustic energy at a frequency based on the set of parameters of the acoustically reactive element.

In some embodiments, a first wall of the plurality of walls may be coupled to an intermediate plate positioned proximate to the backplane. In some embodiments, the first wall of the plurality of walls may be separated from the intermediate plate by a separation distance. In some embodiments, the intermediate plate is separated from the backplane by a gap. In some embodiments, the system further comprises a sound-absorbing material in the gap. In some embodiments, a total distance between the backplane and the second wall may be less than 10 millimeters. In some embodiments, a total distance between the backplane and the second wall may be less than 7 millimeters.

In some embodiments, the acoustically reactive element comprises a side branch style acoustically reactive element, wherein a first wall of the plurality of walls may be proximate the backplane, a second wall of the plurality of walls may be separated from the first wall to define a depth of the acoustically reactive element, a third wall of the plurality of walls and a fourth wall of the plurality of walls may be coupled to the first wall and the second wall, wherein the third wall may be separated from the fourth wall to define a length of the acoustically reactive element, and a fifth wall of the plurality of walls and a sixth wall of the plurality of walls may be coupled to the first wall, the second wall, the third wall and the fourth wall, wherein the fifth wall may be separated from the sixth wall to define a height, wherein the length, depth and height define the internal volume, wherein the acoustical energy reducing opening may be located on one of the fifth wall or the sixth wall proximate a backplane opening of the plurality of backplane openings.

In some embodiments, the acoustically reactive element comprises an expansion chamber style acoustically reactive element, wherein a first wall of the plurality of walls may be proximate the backplane, a second wall of the plurality of walls may be separated from the first wall to define a depth of the acoustically reactive element, a third wall of the plurality of walls and a fourth wall of the plurality of walls may be coupled to the first wall and the second wall, wherein the third wall may be separated from the fourth wall to define a length of the acoustically reactive element, and a fifth wall of the plurality of walls may be coupled to the first wall, the second wall, the third wall and the fourth wall, wherein one or more of the first wall, the second wall, the third wall and the fourth wall define a height, wherein the length, depth and height define the internal volume, wherein the first wall, the second wall, the third wall and the fourth wall define the acoustical energy reducing opening proximate a backplane opening of the plurality of backplane openings.

In some embodiments, the acoustically reactive element comprises a side branch style acoustically reactive element comprising a pair of plates, wherein a first plate of the pair of plates comprises a first shape for a first wall of the plurality of walls, a second plate of the pair of plates comprises a second shape for a second wall of the plurality of walls, and the first plate and the second plate are coupled to form a third wall of the plurality of walls as an outer wall and a fourth wall of the plurality of walls as an inner wall defining an acoustically reactive element opening substantially perpendicular to a direction of an airflow. The first wall may be separated from the second wall by the depth, the acoustically reactive element opening may be positioned proximate a backplane opening of the plurality of backplane openings and the acoustical energy reducing opening may be located on the inner wall. In some embodiments, one or more of the first plate and the second plate is shaped to accommodate a connector on the backplane.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
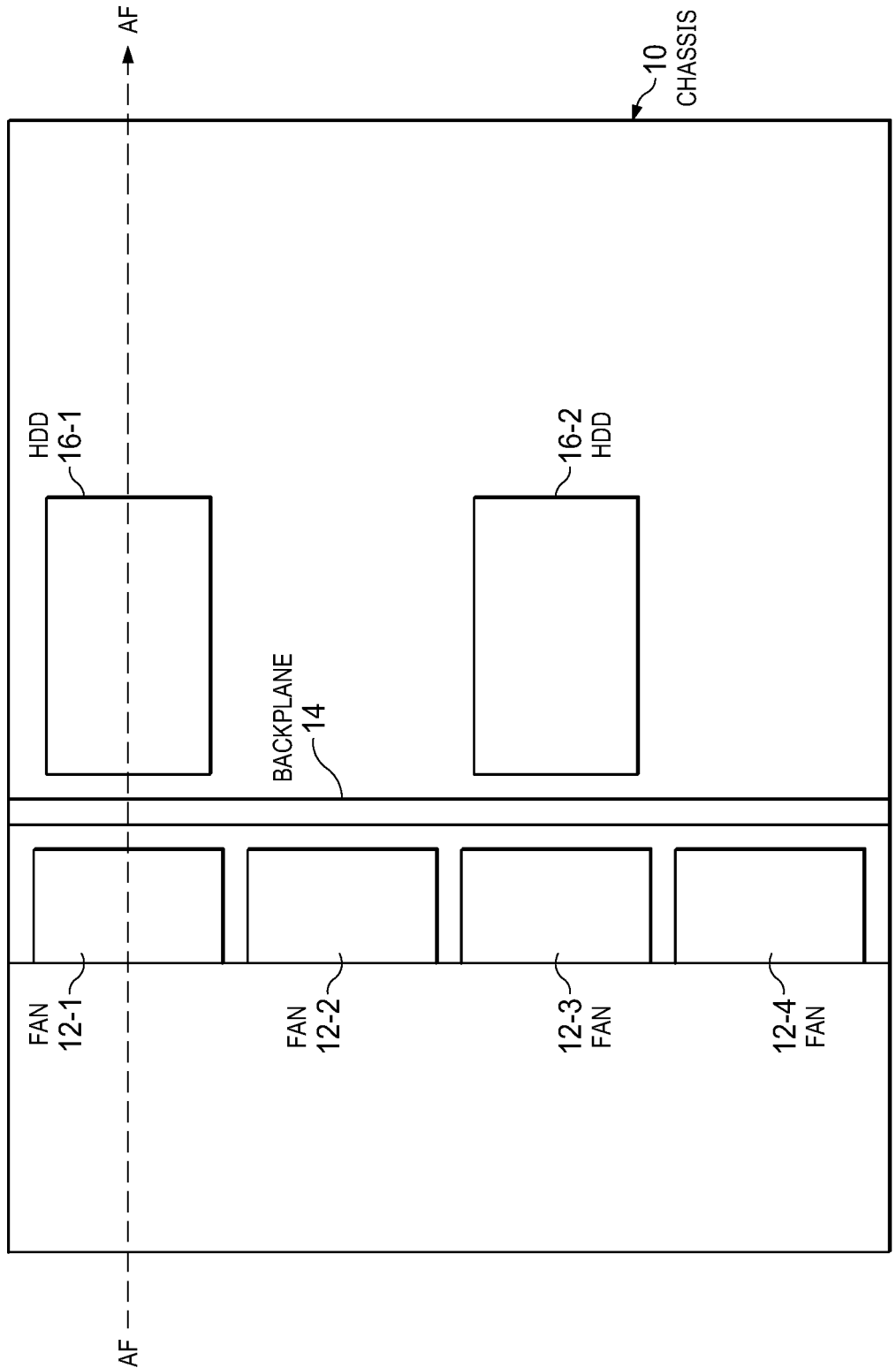
FIG. 1 illustrates an example of a chassis for an information handling system.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Referring to FIG. 1, chassis 10 may comprise a plurality of fans 12, each fan 12 operating at a fan speed to generate an airflow through chassis 10 to cool a set of components 16. Chassis may further include backplane 14 for support and/or spacing between components 16.

Fans 12 and other air movers used to operate to generate airflows to cool an information handling system may produce acoustic energy, which may include fan noise. Fan noise may be characterized as a series of pulses when fan blades slice air, when the airflow is disturbed (such as turbulent shedding around obstacles) and sound pressure relative to the $5^{th}$ power of RPM of an air mover.

Different frequency ranges of acoustics contribute more disturbance to Hard Disk Drive (HDD) dynamics than others. In addition, frequency content output varies by air mover type and manufacturer. Also, acoustic modes may exist (e.g., in space above an HDD). A hard disc drive (HDD), particularly one in close proximity to an air mover 12, may be shaken and/or experience a drop in performance due to the acoustic energy.

A common approach to reducing noise is to limit operation of components 16 in chassis 10 to reduce the amount of heat generated, thus allowing fans 12 to operate at slower speeds. However, users do not want an information handling system operating at a reduced performance level.

Another common approach is to add foam to panels or covers of chassis 10. However, the amount of foam may occupy only a small footprint and therefore only affects a small amount of sound propagation. Furthermore, the location of the foam may not be close to a component 16 such as an HDD 16 that is affected by acoustic energy, resulting in little (if any) benefit.

Another common approach is to add mufflers inside chassis 10. Mufflers may be positioned at an angle to an airflow path such that airflow impedance is increased. Furthermore, mufflers occupy space in chassis 10 such that a chassis 10 may need to be extended to accommodate the mufflers.

To overcome these deficiencies, embodiments may include a system of acoustically reactive elements attached to an intermediate plate positioned proximate to backplane 14 in chassis 10, such that the elements are in line with airflows and sound propagation to filter the acoustic energy before the energy reaches the HDDs 16.

Figure 2:
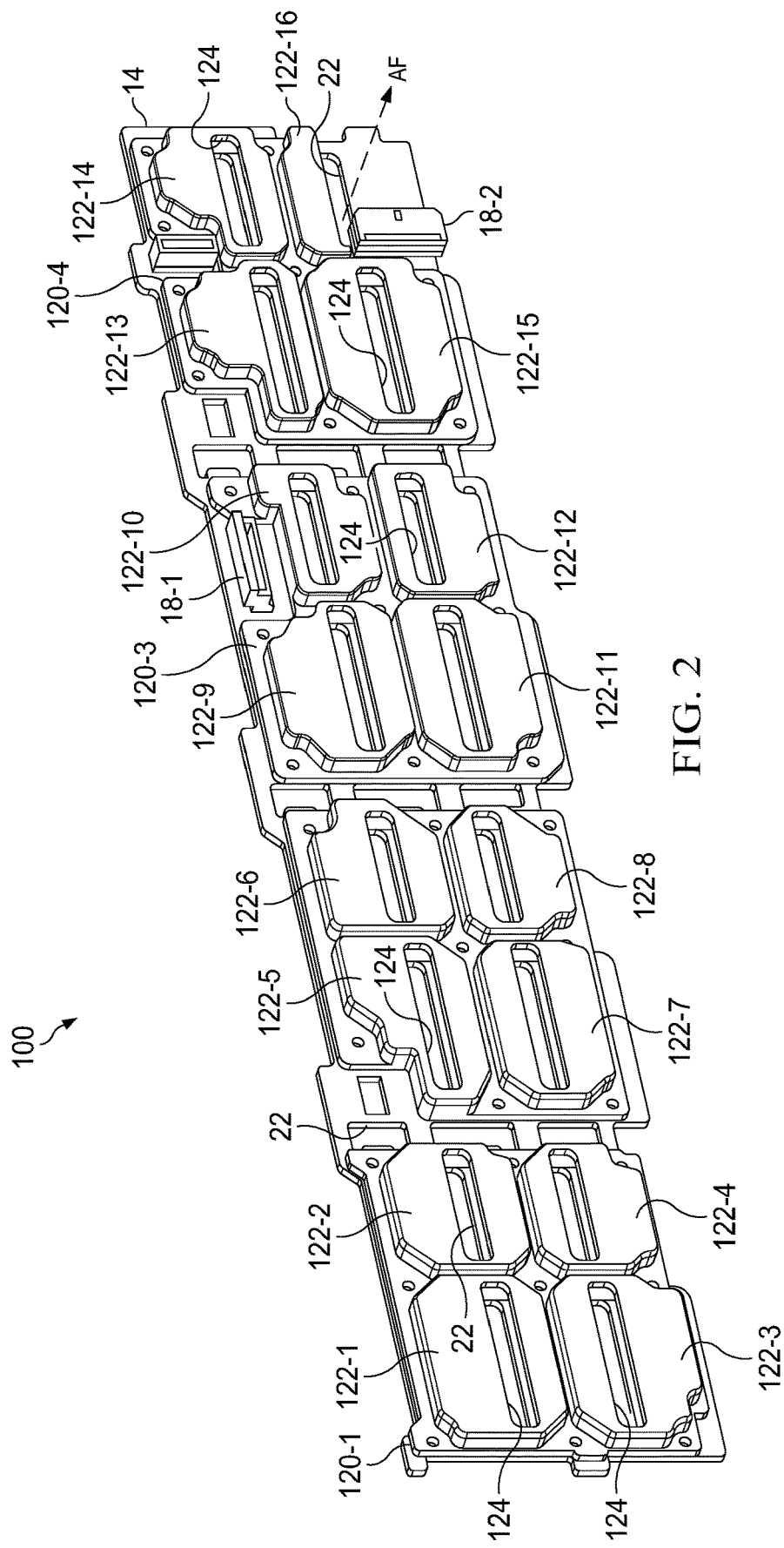
FIG. 2 depicts a perspective view of one embodiment of a system of acoustically reactive elements attached to a backplane.

Referring to FIG. 2, a system 100 for generating reactive acoustic energy in a chassis 10 may comprise a plurality of acoustically reactive elements 122 coupled to backplane 14. A set 120 of a plurality of acoustically reactive elements 122 may be formed with one or more acoustically reactive elements 122. For example, as depicted in FIG. 2, a first set 120-1 may include four acoustically reactive elements 122 (e.g., 122-1, 122-2, 122-3 and 122-4), a second set 120-2 may include four acoustically reactive elements 122 (e.g., 122-5, 122-6, 122-7 and 122-8), a third set 120-3 may include four acoustically reactive elements 122 (e.g., 122-9, 122-10, 122-11 and 122-12) and a fourth set 120-4 may include three acoustically reactive elements 122 (e.g., 122-13, 122-14 and 122-15).

As depicted in one or more of FIGS. 2, 3A, 3B, and 3C, in some embodiments, each acoustically reactive element 122 may be coupled to backplane 14 and configured such that airflow through existing backplane openings 22 passes through acoustically reactive element openings 124. The size, shape and other characteristics of each acoustically reactive element 122 may depend on the size, shape and position of backplane openings 22, the presence of connectors 18 for components in chassis 10 and a target frequency for acoustic energy reduction, discussed in more detail below.

Figure 3A:
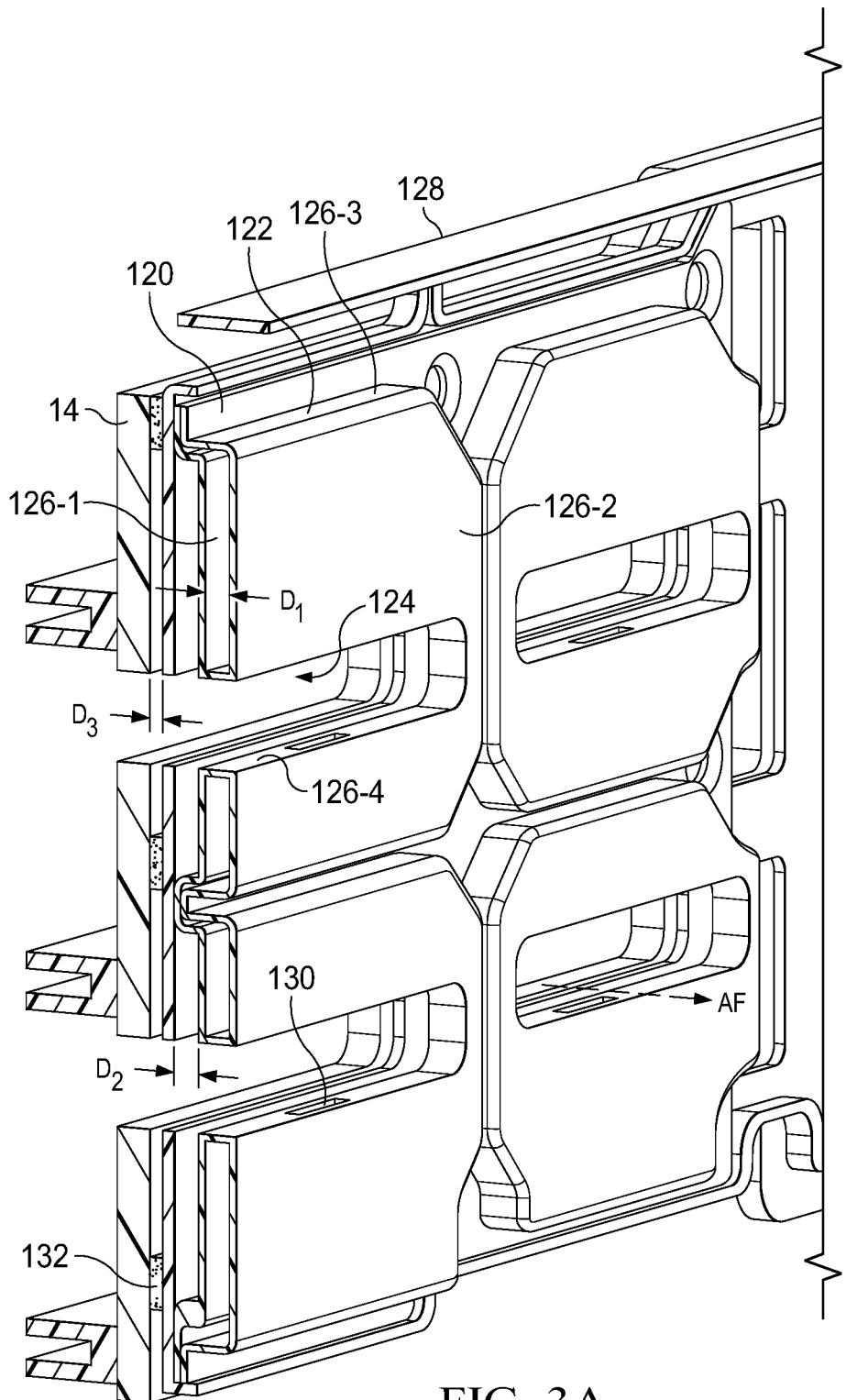
FIG. 3A, FIG. 3B and FIG. 3C depict partial perspective and front views of a portion of a system of acoustically reactive elements attached to an intermediate plate positioned proximate to a backplane.
Figure 3B:
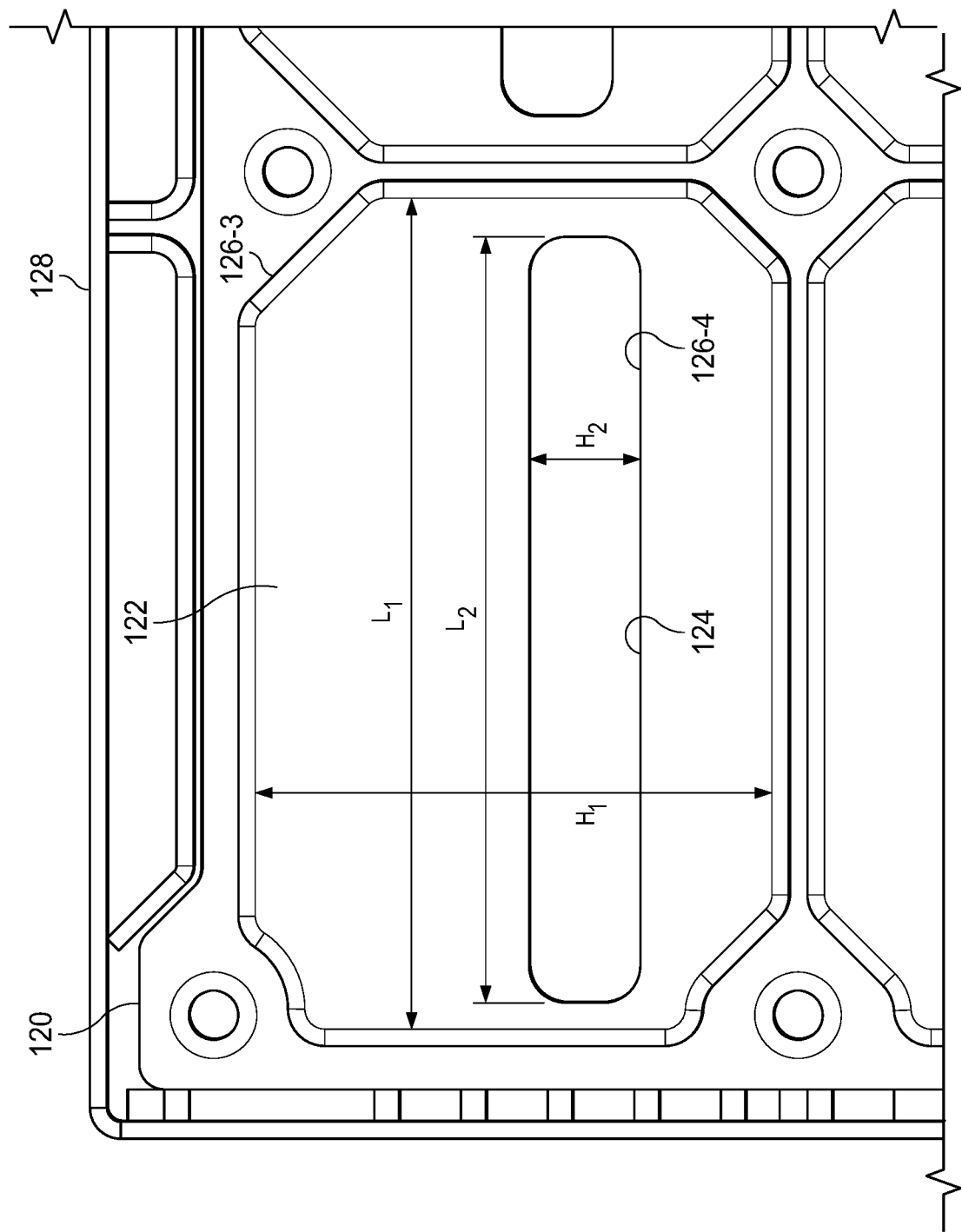
Figure 3C:
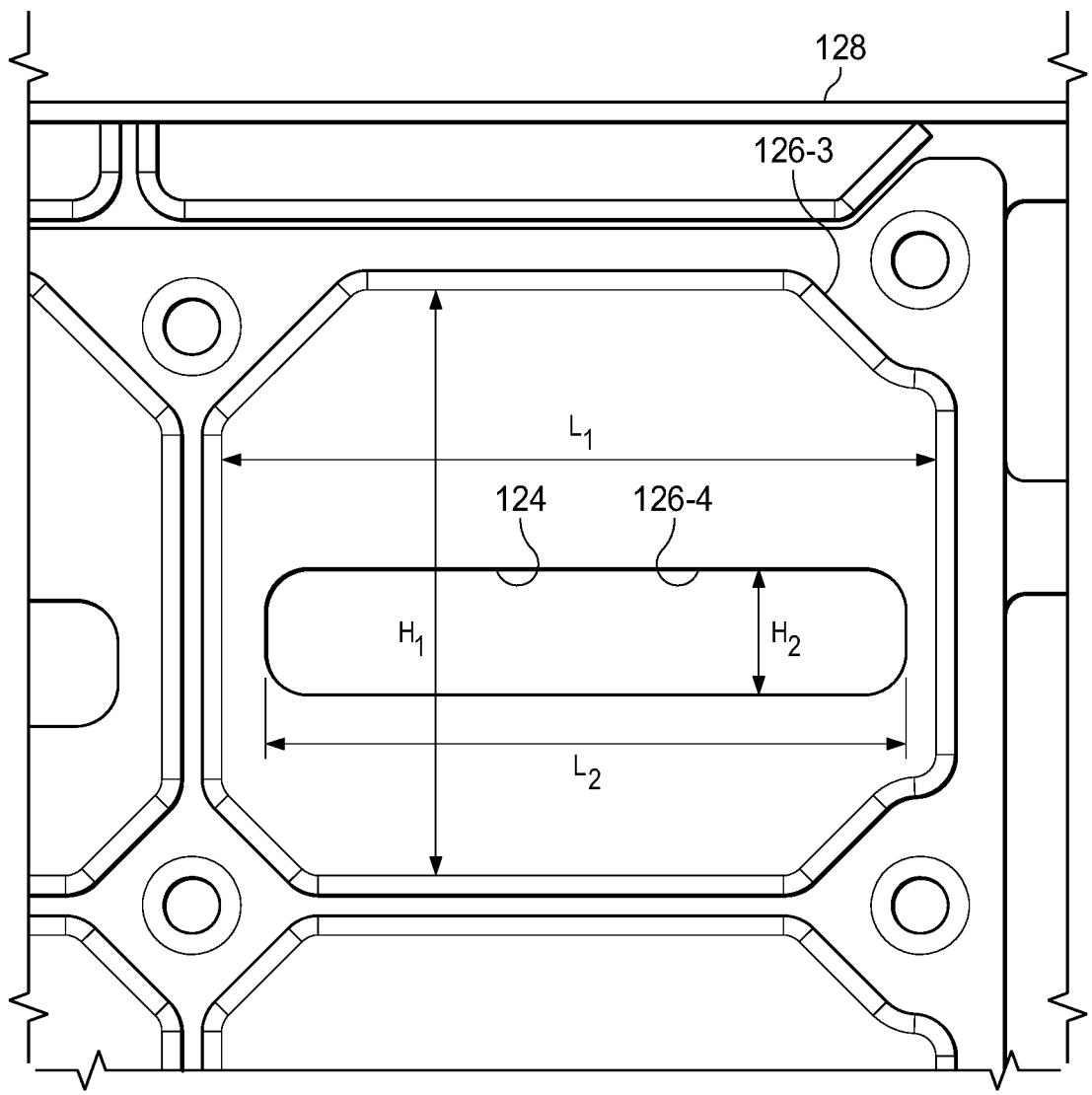

Referring to FIGS. 3A, 3B and 3C, each acoustically reactive element 122 may be formed from two or more plates to form a plurality of walls 126 (e.g., first wall 126-1, second wall 126-2, third wall 126-3 (which may also be referred to as outer wall 126-3 and fourth wall 126-4 (which may also be referred to as inner wall 126-4). In some embodiments, two or more plates may be stamped or otherwise shaped and joined to form an acoustically reactive element 122 or a set 120 of acoustically reactive elements 122, with each acoustically reactive element 122 having a plurality of walls 126 defining a set of parameters or dimensions such as a depth ($D_1$) between first wall 126-1 and second wall 126-2, a height ($H_1$) defined based on third wall 126-3 and a length ($L_1$) defined based on third wall 126-3, wherein the depth, height and length may be configured for generating acoustic energy at a desired frequency or range of frequencies. In some embodiments, one or more walls 126 may be shaped to accommodate features on backplane 14, such as connectors 22 or hardware.

Referring to FIG. 3A, in some embodiments, a set 120 of acoustically reactive elements 122 may be coupled to intermediate plate 128 for positioning near backplane 14 such that an acoustic energy generating opening for each acoustically reactive element 122 is positioned in an airflow. In some embodiments, one or more plates used to form acoustically reactive elements 122 may be configured to provide a separation distance $D_2$ between first wall 126-1 and intermediate plate 128. In some embodiments, intermediate plate 128 may be positioned a gap distance $D_3$ from backplane 14. In some embodiments, acoustic-absorbing material 132 may be positioned between intermediate plate 128 and backplane 14. One or more of the separation distance $D_2$, the gap distance $D_3$ and acoustic-absorbing material 132 may isolate acoustically reactive elements 122. In some embodiments, separation distance $D_2$ may be less than 5 mm, less than 4 mm, or less than 3 mm for example. In some embodiments, gap distance $D_3$ may be less than 4 mm, less than 3 mm, or less than 2 mm for example. In some embodiments, the combination of depth $D_1$, separation distance $D_2$ and gap distance $D_3$ may be less than 10 mm, less, than 7 mm or less than 5 mm for example.

Side Branch Resonators

A side branch resonator may generate acoustic energy based on the following equation:

$$f(0)=c0/(2*Pi)*\mathrm{sqrt}((A/I)*(1/V)) \qquad \text{Eq. 1}$$

in which c0 equals the speed of sound (e.g., 343 meters/second), A is the area of acoustic energy generating opening 130, I is the depth of the neck of acoustic energy generating opening 130 and V is the volume of acoustically reactive element 122. For acoustically reactive element 122 having a depth of 5 mm, a height of 25 mm and a width of 50 mm, the volume may be 6250 mm^3. For acoustic energy generating opening 130 having a rectangular profile of 3 mm×5 mm and I of approximately 0.0037 mm, a side branch resonator may be capable of generating acoustic energy at a frequency between 1200 to 1700 Hz (+/−400 Hz) associated with a range of frequencies that could negatively affect the performance of HDDs 16.

Airflow May Pass Through an Acoustically Reactive Element—Side Branch Resonators As depicted in FIG. 2, in some embodiments, each acoustically reactive element 122 may comprise an acoustically reactive element opening 124 for positioning proximate to a backplane opening 22 and oriented generally perpendicular to a direction of an airflow, wherein air flows through acoustically reactive element opening 124. As depicted in FIGS. 3B and 3C, each acoustically reactive element opening 124 may have a length ($L_2$) and a height ($H_2$) wherein the length and height of acoustically reactive element opening 124 may be configured to allow airflow through acoustically reactive element 122 and directed over acoustic energy generating opening 130.

In some embodiments, each acoustically reactive element 122 may be configured to generate reactive acoustic energy at a frequency or range of frequencies based on the dimensions of acoustic energy generating opening 130, the dimensions of acoustically reactive element opening 124 and the dimensions of acoustically reactive element 122. In some embodiments, each acoustically reactive element 122 may be configured to generate reactive acoustic energy at a frequency or range of frequencies based on a ratio of the dimensions of acoustically reactive element opening 124 and the dimensions of acoustically reactive element 122. In some embodiments, each acoustically reactive element 122 may be configured to generate reactive acoustic energy at a frequency or range of frequencies based on a ratio of the dimensions of acoustic energy generating opening 130 and the dimensions of acoustically reactive element opening 124.

Airflow May Pass Over an Acoustically Reactive Element—Side Branch Resonators

Figure 4:
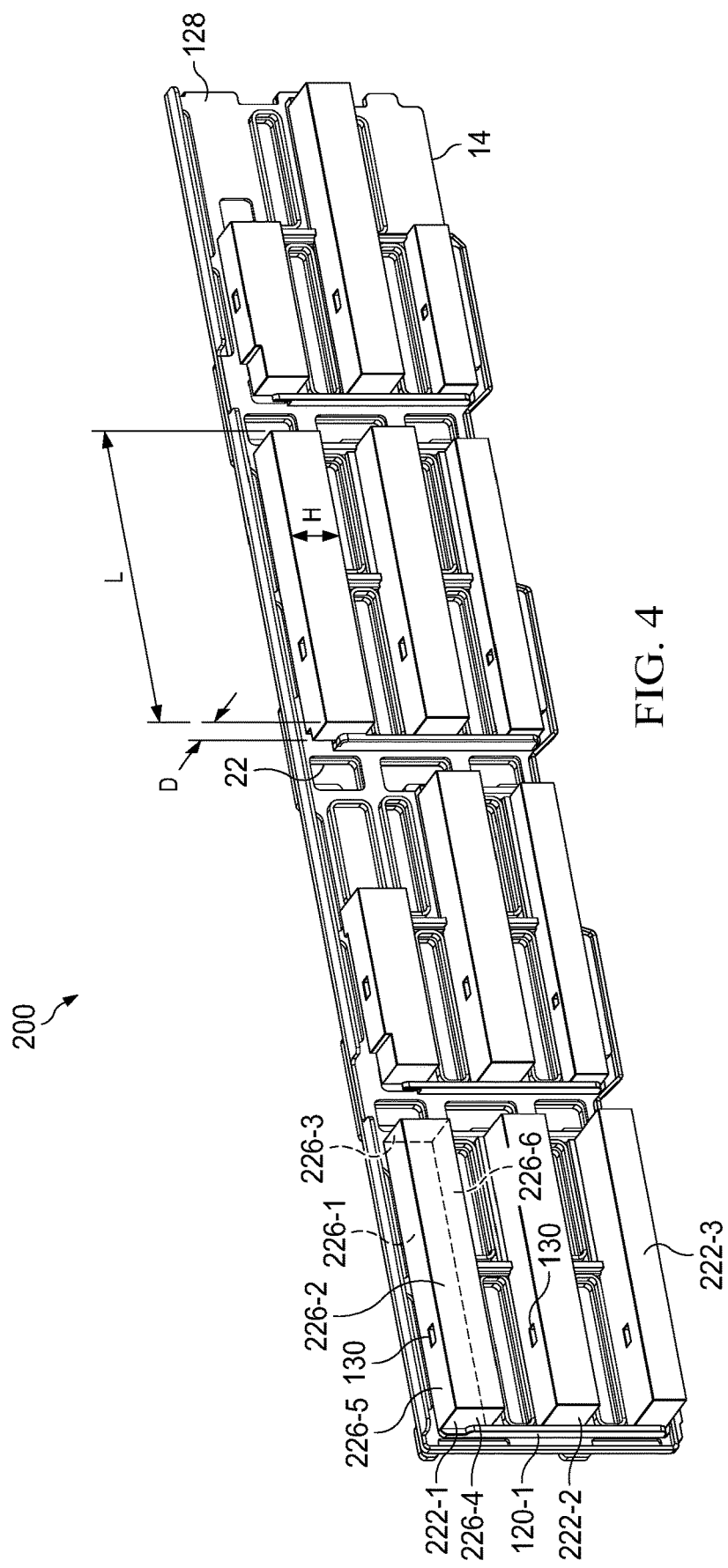
FIG. 4 depicts a perspective view of one embodiment of a system of side branch type acoustically reactive elements attached to an intermediate plate positioned proximate to a backplane.

Referring to FIG. 4, in some embodiments, one or more acoustically reactive elements 222 may be formed as side branch style resonators with each acoustically reactive element 222 comprising six walls 226 defining an internal volume. First wall 226-1 (which may also be referred to as front wall 226-1) may be coupled to intermediate plate 128 or may be proximate to backplane 14 and may define a length (L) of the acoustically reactive element 222. Second wall 226-2 may be located a distance (e.g., $D_1$) from first wall 226-1. Third and fourth walls 226-3 and 226-4 (which may also be referred to as side walls 226-3 and 226-4) may be coupled to first wall 226-1 and second wall 226-2 to define depth (D). Fifth wall 226-5 (which may also be referred to as top wall 336-5) and sixth wall 226-6 (which may also be referred to as bottom wall 226-6) may be coupled to walls 226-1, 226-2, 226-3 and 226-4 to define a height (H) of acoustically reactive element 222. Fifth wall 226-5 may be formed with acoustic energy generating opening 130. Walls 226 define an internal volume of each acoustically reactive element 222, wherein a frequency or range of frequencies associated with acoustic energy generated by each acoustically reactive element 222 may be based on the internal volume.

Each acoustically reactive element 222 may be positioned proximate an opening 22 in backplane 14, with fifth wall 226-5 oriented substantially perpendicular to an airflow such that airflow flowing over acoustically reactive element 222 passes acoustical energy reducing opening 130. Acoustic energy generating opening 130 may be configured to generate acoustic energy based on an airflow passing over acoustically reactive element 222. The position of acoustic energy generating opening 130 on fifth wall 226-5 may be based on an airflow passing through opening 22 but may generally be located anywhere along length L of acoustically reactive element 222. As depicted in FIG. 4, in some embodiments, an acoustically reactive element 222 may have a length (L) to span a length or a portion of a length of an opening 22 in backplane 14.

In some embodiments, each acoustically reactive element 222 may be configured to generate acoustic energy at a frequency or range of frequencies based on the dimensions of acoustic energy generating opening 130 and the dimensions of acoustically reactive element 222. In some embodiments, each acoustically reactive element 222 may be configured to generate acoustic energy at a frequency or range of frequencies based on a ratio of the dimensions of acoustic energy generating opening 130 and the dimensions of acoustically reactive element 222.

Similar to the embodiment depicted in FIG. 3A, in some embodiments, a set 120 of acoustically reactive elements 222 may be coupled to intermediate plate 128 for positioning near backplane 14. In some embodiments, one or more plates used to form acoustically reactive elements 222 may be configured to provide a separation distance $D_2$ between first wall 226-1 and intermediate plate 128. In some embodiments, intermediate plate 128 may be positioned a gap distance $D_3$ from backplane 14. In some embodiments, acoustic-absorbing material 132 may be positioned between intermediate plate 128 and backplane 14. One or more of the separation distance $D_2$, the gap distance $D_3$ and acoustic-absorbing material 132 may isolate acoustically reactive elements 222. In some embodiments, separation distance $D_2$ may be less than 5 mm, less than 4 mm, or less than 3 mm for example. In some embodiments, gap distance $D_3$ may be less than 4 mm, less than 3 mm, or less than 2 mm for example. In some embodiments, the combination of depth $D_1$, separation distance $D_2$ and gap distance $D_3$ may be less than 10 mm, less, than 7 mm or less than 5 mm for example.

Expansion Chamber

An expansion chamber may have a transmission loss (TL) calculated as $$TL = 10^* \log 10(1 + \tfrac{1}{4}(m - 1/m)^{\wedge}2^* \sin {}^{\wedge}2(kD_1)), \qquad \text{Eq. 2}$$

where m is a ratio between the cross-sectional area of the chamber and the backplane opening 22, D1 is the depth of acoustically reactive element 222 and k is the wave number (e.g., k=2*Pi/wavelength). A target frequency for an expansion chamber may be equal to or greater than approximately 4000 Hz.

Airflow May Pass Over an Acoustically Reactive Element—Expansion Chamber

Figure 5:
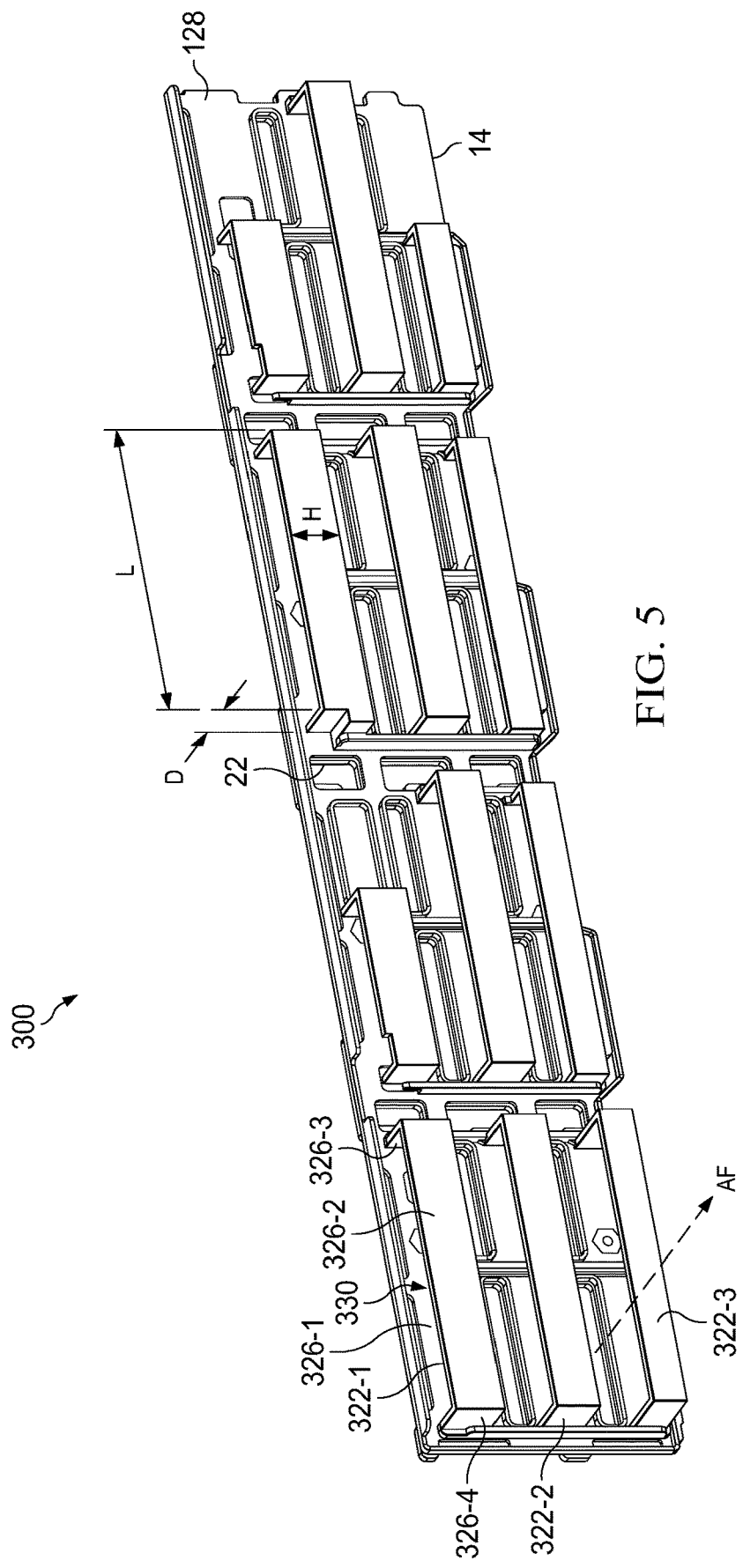
FIG. 5 depicts a perspective view of one embodiment of a system of expansion chamber type acoustically reactive elements attached to an intermediate plate positioned proximate to a backplane.

Referring to FIG. 5, in some embodiments, a set of acoustically reactive elements 322 may be configured as expansion chamber type acoustically reactive elements 322 with a set of five walls 326. First wall 326-1 (which may also be referred to as front wall 326-1) may be coupled to intermediate plate 128 or may be proximate to backplane 14 and have a length (L). Second wall 326-2 may also be formed with length (L). Third and fourth walls 326-3 and 326-4 (which may also be referred to as side walls 326-3 and 326-4) may be coupled to first wall 326-1 and second wall 326-2 to define depth D (similar to depth $D_1$ depicted in FIG. 3A). Fifth wall 326-5 (which may also be referred to as bottom wall 326-5) may be coupled to walls 326,1, 326-2, 326-3 and 326-4. Instead of a sixth wall, embodiments may be formed with an open top functioning as an acoustic energy generating opening 130, wherein first wall 326-1, second wall 326-2, third wall 326-3 and fourth wall 326-4 define the acoustical energy reducing opening. Walls 326 define an internal volume of each acoustically reactive element 322, wherein a frequency or range of frequencies associated with acoustic energy generated by each acoustically reactive element 222 may be based on the internal volume.

Similar to the embodiment depicted in FIG. 3A, in some embodiments, a set 120 of acoustically reactive elements 322 may be coupled to intermediate plate 128 for positioning near backplane 14. In some embodiments, one or more plates used to form acoustically reactive elements 322 may be configured to provide a separation distance $D_2$ between first wall 326-1 and intermediate plate 128. In some embodiments, intermediate plate 128 may be positioned a gap distance $D_3$ from backplane 14. In some embodiments, acoustic-absorbing material 132 may be positioned between intermediate plate 128 and backplane 14. One or more of the separation distance $D_2$, the gap distance $D_3$ and acoustic-absorbing material 132 may isolate acoustically reactive elements 322. In some embodiments, separation distance $D_2$ may be less than 5 mm, less than 4 mm, or less than 3 mm for example. In some embodiments, gap distance $D_3$ may be less than 4 mm, less than 3 mm, or less than 2 mm for example. In some embodiments, the combination of depth $D_1$, separation distance $D_2$ and gap distance $D_3$ may be less than 10 mm, less, than 7 mm or less than 5 mm for example.

Figure 6:
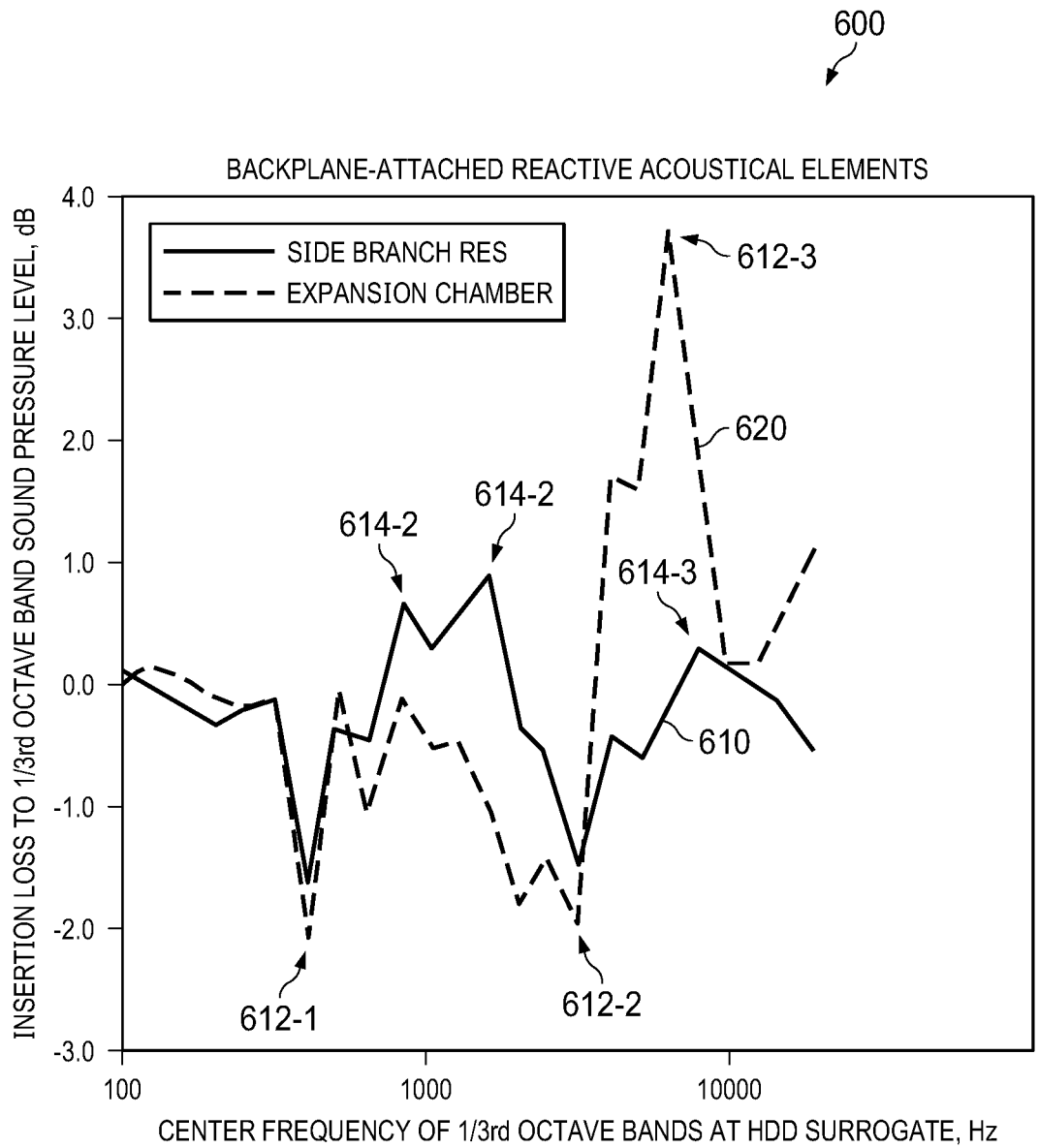
FIG. 6 depicts a graph of insertion loss relative to center frequency for of a system of side branch type acoustically reactive elements and a system of expansion chamber type acoustically reactive elements, illustrating benefits associated with embodiments of a system of acoustically reactive elements.

Referring to FIG. 6, a set of acoustically reactive elements 122, 222 or 322 may be configured to reduce acoustic energy in a chassis 10 for a frequency or a range of frequencies.

In some embodiments, solid line 610 corresponds to side branch style acoustically reactive elements 122 or 222 such as depicted in FIGS. 2, 3A, 3B, 3C and 4. A set of side branch style acoustically reactive elements 122 or 222 may be capable of generating reactive acoustic energy over a smaller range of frequencies for more targeted reduction of acoustic energy. In some embodiments, a set of acoustically reactive elements 122 or 222 may be configured to generate acoustic energy based on a frequency or range of frequencies associated with degraded performance of a component in chassis 10. In some embodiments, a set of acoustically reactive elements 122 or 222 may be configured to generate acoustic energy based on a frequency or range of frequencies associated with degraded performance of an HDD 16 in chassis 10. Thus, points 612-1, 612-2 and 612-3 in graph 600 indicate acoustically reactive elements 122 or 222 may be configured to generate acoustic energy targeting certain frequencies. Point 612-3 in graph indicate acoustically reactive elements 122 or 222 may reduce acoustic energy at a frequency associated with degraded performance of HDDs 16.

Dashed line 620 corresponds to expansion chamber style acoustically reactive elements 322 such as depicted in FIG. 5. A set of expansion chamber style acoustically reactive elements 322 may be capable of generating reactive acoustic energy over a wider range of frequencies for more broadband reduction of acoustic energy. In some embodiments, a set of acoustically reactive elements 322 may be configured to generate acoustic energy based on a frequency or range of frequencies associated with degraded performance of a component in chassis 10. In some embodiments, a set of acoustically reactive elements 322 may be configured to generate acoustic energy over a range of frequencies associated with degraded performance of an HDD 16 in chassis Points 612-1 and 612-2 in graph 600 indicate acoustically reactive elements 322 may not reduce acoustic energy and may actually increase acoustic energy. However, the frequency may not be associated with degraded performance of HDDs 16. Point 612-3 in graph indicate acoustically reactive elements 322 may generate more acoustic energy at a frequency associated with degraded performance of HDDs 16

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for generating reactive acoustic energy for reducing acoustic noise produced by a fan generating an airflow in a chassis of an information handling system, the system comprising:
   a set of acoustically reactive elements positioned relative to a backplane comprising a plurality of backplane openings, wherein each acoustically reactive element comprises:
      a plurality of walls, wherein the plurality of walls define an internal volume, wherein at least one wall is aligned parallel with a direction of airflow, wherein a first wall of the plurality of walls is coupled to an intermediate plane positioned proximate to the backplane and separated from the backplane by a gap;
      a sound absorbing material in the gap; and
      an acoustical energy reducing opening oriented substantially parallel with the direction of the airflow, and configured for the airflow passing the acoustically reactive element to pass the acoustical energy reducing opening to generate acoustic energy at a frequency based on the set of parameters of the acoustically reactive element.

2. The system of claim 1, wherein the first wall of the plurality of walls is separated from the intermediate plate by a separation distance.

3. The system of claim 1, wherein a total distance between the backplane and a second wall is less than 10 millimeters.

4. The system of claim 1, wherein a total distance between the backplane and a second wall is less than 7 millimeters.

5. The system of claim 1, wherein the acoustically reactive element comprises a side branch style acoustically reactive element, wherein:
   a second wall of the plurality of walls is separated from the first wall to define a depth of the acoustically reactive element;
   a third wall of the plurality of walls and a fourth wall of the plurality of walls are coupled to the first wall and the second wall, wherein the third wall is separated from the fourth wall to define a length of the acoustically reactive element;
   a fifth wall of the plurality of walls and a sixth wall of the plurality of walls are coupled to the first wall, the second wall, the third wall and the fourth wall, wherein the fifth wall is separated from the sixth wall to define a height, wherein the length, depth and height define the internal volume,
   wherein the acoustical energy reducing opening is located on one of the fifth wall or the sixth wall proximate a backplane opening of the plurality of backplane openings.

6. The system of claim 1, wherein the acoustically reactive element comprises an expansion chamber style acoustically reactive element, wherein:
   a second wall of the plurality of walls is separated from the first wall to define a depth of the acoustically reactive element;
   a third wall of the plurality of walls and a fourth wall of the plurality of walls are coupled to the first wall and the second wall, wherein the third wall is separated from the fourth wall to define a length of the acoustically reactive element;
   a fifth wall of the plurality of walls is coupled to the first wall, the second wall, the third wall and the fourth wall, wherein one or more of the first wall, the second wall, the third wall and the fourth wall define a height, wherein the length, depth and height define the internal volume, wherein the first wall, the second wall, the third wall and the fourth wall define the acoustical energy reducing opening proximate a backplane opening of the plurality of backplane openings.

7. The system of claim 1, wherein the acoustically reactive element comprises a side branch style acoustically reactive element comprising:
a pair of plates, wherein:
a first plate of the pair of plates comprises a first shape for the first wall of the plurality of walls;
a second plate of the pair of plates comprises a second shape for a second wall of the plurality of walls; and
the first plate and the second plate are coupled to form a third wall of the plurality of walls as an outer wall and a fourth wall of the plurality of walls as an inner wall defining an acoustically reactive element opening substantially perpendicular to a direction of an airflow, wherein
the first wall is separated from the second wall by the depth,
the acoustically reactive element opening is positioned proximate a backplane opening of the plurality of backplane openings and
the acoustical energy reducing opening is located on the inner wall.

8. The system of claim 7, wherein one or more of the first plate and the second plate is shaped to accommodate a connector on the backplane.

9. A chassis for an information handling system, comprising:
a plurality of components;
a fan for generating an airflow in the chassis; and
a set of acoustically reactive elements positioned relative to a backplane comprising a plurality of backplane openings, wherein each acoustically reactive element comprises:
a plurality of walls, wherein the plurality of walls define an internal volume, wherein at least one wall is aligned parallel with a direction of airflow, wherein a first wall of the plurality of walls is coupled to an intermediate plane positioned proximate to the backplane and separated from the backplane by a gap;
a sound absorbing material in the gap; and
an acoustical energy reducing opening oriented substantially parallel with the direction of the airflow, and configured for the airflow passing the acoustically reactive element to pass the acoustical energy reducing opening to generate acoustic energy at a frequency based on the set of parameters of the acoustically reactive element.

10. The chassis of claim 9, wherein the first wall of the plurality of walls is separated from the intermediate plate by a separation distance.

11. The chassis of claim 9, wherein the acoustically reactive element comprises a side branch style acoustically reactive element, wherein:
a second wall of the plurality of walls is separated from the first wall to define a depth of the acoustically reactive element;
a third wall of the plurality of walls and a fourth wall of the plurality of walls are coupled to the first wall and the second wall, wherein the third wall is separated from the fourth wall to define a length of the acoustically reactive element;
a fifth wall of the plurality of walls and a sixth wall of the plurality of walls are coupled to the first wall, the second wall, the third wall and the fourth wall, wherein the fifth wall is separated from the sixth wall to define a height, wherein the length, depth and height define the internal volume,
wherein the acoustical energy reducing opening is located on one of the fifth wall or the sixth wall proximate a backplane opening of the plurality of backplane openings.

12. The chassis of claim 9, wherein the acoustically reactive element comprises an expansion chamber style acoustically reactive element, wherein:
a second wall of the plurality of walls is separated from the first wall to define a depth of the acoustically reactive element;
a third wall of the plurality of walls and a fourth wall of the plurality of walls are coupled to the first wall and the second wall, wherein the third wall is separated from the fourth wall to define a length of the acoustically reactive element;
a fifth wall of the plurality of walls is coupled to the first wall, the second wall, the third wall and the fourth wall, wherein one or more of the first wall, the second wall, the third wall and the fourth wall define a height, wherein the length, depth and height define the internal volume,
wherein the first wall, the second wall, the third wall and the fourth wall define the acoustical energy reducing opening proximate a backplane opening of the plurality of backplane openings.

13. The chassis of claim 9, wherein the acoustically reactive element comprises a side branch style acoustically reactive element comprising:
a pair of plates, wherein:
a first plate of the pair of plates comprises a first shape for the first wall of the plurality of walls;
a second plate of the pair of plates comprises a second shape for a second wall of the plurality of walls; and
the first plate and the second plate are coupled to form a third wall of the plurality of walls as an outer wall and a fourth wall of the plurality of walls as an inner wall defining an acoustically reactive element opening substantially perpendicular to a direction of an airflow, wherein
the first wall is separated from the second wall by the depth,
the acoustically reactive element opening is positioned proximate a backplane opening of the plurality of backplane openings and
the acoustical energy reducing opening is located on the inner wall.

14. The chassis of claim 13, wherein one or more of the first plate and the second plate is shaped to accommodate a connector on the backplane.

* * * * *